United States Patent
Yoon et al.

(10) Patent No.: US 7,599,222 B2
(45) Date of Patent: Oct. 6, 2009

(54) SEMICONDUCTOR MEMORY DEVICE USING PIPELINED-BUFFER PROGRAMMING AND RELATED METHOD

(75) Inventors: Chi-Weon Yoon, Seoul (KR); Heung-Soo Lim, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 442 days.

(21) Appl. No.: 11/520,665

(22) Filed: Sep. 14, 2006

(65) Prior Publication Data

US 2007/0150646 A1 Jun. 28, 2007

(30) Foreign Application Priority Data

Dec. 28, 2005  (KR)  .................... 10-2005-0131859

(51) Int. Cl.
*G11C 11/34* (2006.01)
(52) U.S. Cl. ..................... 365/185.22; 365/185.05; 365/189.05
(58) Field of Classification Search ............ 365/185.22, 365/185.05, 189.05
See application file for complete search history.

(56) References Cited

U.S. PATENT DOCUMENTS

| | | | |
|---|---|---|---|
| 6,259,628 B1 * | 7/2001 | Park ..................... | 365/185.22 |
| 6,421,274 B1 | 7/2002 | Yoshimura | |
| 6,625,063 B2 * | 9/2003 | Kim ..................... | 365/185.28 |
| 6,697,287 B2 | 2/2004 | Furukawa | |
| 6,842,377 B2 | 1/2005 | Takano et al. | |
| 2005/0237820 A1 * | 10/2005 | Takemura et al. ...... | 365/189.05 |

FOREIGN PATENT DOCUMENTS

| | | |
|---|---|---|
| JP | 2002-288034 | 10/2002 |
| JP | 2003-216483 | 7/2003 |
| JP | 2003-308698 | 10/2003 |

* cited by examiner

*Primary Examiner*—Son Dinh
(74) *Attorney, Agent, or Firm*—Volentine & Whitt, PLLC

(57) ABSTRACT

Disclosed is a semiconductor memory device which is operable a pipelined-buffer programming and includes a cell array including a plurality of memory cells, a write driver circuit divided into a plurality of write units, each write unit programming memory cells with a first data, a sense amplifier circuit divided into plurality of read units of the same number as the plurality of write units, each read unit sensing bit lines of the cell array during a program verify operation, a selection circuit for selecting one of the write units and one of the read units in response to a column address and a data input circuit for providing the first data to the selected write unit during a program operation and for receiving verifying data from the selected read unit during the program verify operation.

16 Claims, 5 Drawing Sheets

SEMICONDUCTOR MEMORY DEVICE USING PIPELINED-BUFFER PROGRAMMING AND RELATED METHOD

BACKGROUND OF THE INVENTION

1. Field of the Invention

Embodiments of the invention relate to various systems and methods related to semiconductor memory devices. More particularly, embodiments of the invention relate to non-volatile semiconductor memory devices having a fast continuous burst read mode capability.

This application claims priority under 35 U.S.C § 119 to Korean Patent Application 2005-131859 filed on Dec. 28, 2005, the subject matter of which is hereby incorporated by reference.

2. Description of the Related Art

High speed, high density flash memories are increasingly favored for use in mobile systems. Two forms of prominent flash memories include the NAND-type flash memory in which memory cells are serially connected to a bit line, and the NOR-type flash memory in which memory cells are connected in parallel to a bit line. The NOR-type flash memory has a faster access speed than the NAND-type flash memory, which makes the NOR-type flash memory more competitive for use with high-frequency memory systems. However, because of its larger current consumption, the NOR-type flash memory has a relative disadvantage with respect to high density integration.

A cell array of a NOR-type flash memory includes a plurality of banks, each of which has a plurality of sectors with each sector having a plurality of memory cells. In general, erase operations of NOR-type flash memories are executed by sector units and program operations are executed by a byte or word unit.

In order to program data to a cell array of a NOR-type flash memory, a program command and a program address can be input to the memory, which causes a program voltage to be applied to the appropriate selected bit lines that physically executes the program operation. After program execution, a "program verify" operation can be executed to verify whether the desired program data was stored in the selected memory cells. The program and verify operations can be iteratively executed until all of the desired data all is programmed to the selected memory cells.

In advance of a program operation, the memory block corresponding to the program address may be erased, i.e., each memory cell is set to a [1] for a Single Level Cell (SLC) device or a [11] for a Multi-Level Cell (MLC) device. If program data is a [1] (SLC) or a [11] (MLC), no program voltage is applied to a corresponding bit line as the preservation of an erased state has the same effect as the programming of [1](SLC) or [11](MLC) data to the selected memory cell.

Considering the program characteristics of NOR-type flash memories, it is more time effective to scan incoming data bits for non-erased states, e.g., [0] or [01], and program only the non-erased states, than to simply program all incoming bits. To further increase program speed, the above-mentioned scanning and programming procedures may be performed simultaneously using a programming scheme referred to as a "Pipelined Buffer Program scheme"

Referring to FIG. 1, a conventional semiconductor memory device supporting a pipelined buffer program scheme will be described. As shown in FIG. 1, the conventional semiconductor memory device includes a cell array 10, a sense amplifier and write driver block 20, a data buffer block 30, a bit scanning block 40, a write driver latch block 50 and control logic 60. The control logic 60 controls the pipelined-buffer program operation described below.

To program the cell array 10, N-word program data is loaded on the data buffer block 30 in 4N-word data units. Next, the bit scanning block 40 receives the N-word data from the data buffer block 30 and sequentially stores the N-word data in an internal scan latch circuit 41. Then, the bit scanning block 40 can scan the N-word data stored in the scan latch 41 to select those data bits with a non-erased state. Subsequently, the write driver latch block 50 can receive the scanned data bits from the bit scanning block 40 and provide them to the sense amplifier and write driver block 20.

Once the scanned data bits are received by the sense amplifier and write driver block 20, the sense amplifier and write driver block 20 can apply a program voltage to bit lines corresponding to the received scanned data bits, and programming and scanning of the scanned data bits can be executed simultaneously. The concurrent programming and scanning operations enables a program speed of the NOR-type flash memory to be improved.

FIG. 2 shows the flow of a data programming procedure for a memory device, such as the memory device illustrated in FIG. 1. Referring to FIG. 2, a sense amplifier and write driver block 20 includes a write driver circuit 21 and a sense amplifier circuit 22. The write driver circuit 21 includes multiple write drivers (not shown), and the sense amplifier circuit 22 includes multiple sense amplifiers (also not shown). The number of write drivers in the write driver circuit 21 is the same as the number of sense amplifiers in the sense amplifier circuit 22. Hereinafter, the number of write drivers is referred to as a "write driver size", and the number of sense amplifiers is referred to as a "sense amplifier size". Accordingly, the write driver size of the write driver circuit 21 is the same as the sense amplifier size of the sense amplifier circuit 22. The numbers of latches and buffers in the data buffer block 130, the bit scanning block 140, and the write driver latch block 150 are determined on the sense amplifier size and the write driver size.

It should be appreciated that systems that adopted the above-mentioned memory devices are gradually using ever-higher higher clock frequencies and larger storage capacities. To satisfy this demand, the incorporated memory devices are required to have more memory cells and more sense amplifiers per bank. However, these needs result in various disadvantages. For example, the increase of sense amplifiers leads to an increase in latches, e.g., latches in the scan latch circuit 41 and the driver latch block 50. This in turn leads to an increase in chip size. Additionally, the increase of sense amplifiers leads to the increase of main data lines (MDLs), which leads to an increase in layout area/chip size. Further, during a read-while-write (RWW) operation, the increase of sense amplifiers causes verify sensing noise, which can affect a read operation of another bank.

Accordingly, it is desirable to prevent the above drawbacks caused when the number of sense amplifiers and write drivers are increased to realize high-speed and high-density NOR-type flash memories.

SUMMARY OF THE INVENTION

According to one aspect of the invention, there is provided a semiconductor memory device comprising a cell array including a plurality of memory cells, a write driver circuit divided into a plurality of write units, each write unit programming memory cells with a first data, a sense amplifier circuit divided into plurality of read units of the same number as the plurality of write units, each read unit sensing bit lines of the cell array during a program verify operation, a selection circuit for selecting one of the write units and one of the read units in response to a column address, and a data input circuit for providing the first data to the selected write unit during a program operation and for receiving verifying data from the selected read unit during the program verify operation.

According to another aspect of the invention, there is provided a semiconductor memory device comprising a cell array including a plurality of memory cells, a column select unit selecting bit lines of the cell array in response to column address, a write driver circuit divided into a plurality of write units, each write unit programming memory cells with N-bit (N is positive integer) data during a programming cycle, a sense amplifier circuit divided by a plurality of read units, each of which senses memory cells with N-bits (N is positive integer) data during a program verify operation, a selection circuit responsive to a column address, selecting one among the write units during a programming operation and one among the read units during a program verify operation; and a data input circuit supplying N bits of program data to the selected write unit during a program operation and receiving N bits of verify data from the selected read unit during the program verify operation.

BRIEF DESCRIPTION OF THE DRAWINGS

For a better understanding of the invention, and to show how embodiments of the same may be carried into effect, reference will now be made, by way of example, to the accompanying diagrammatic drawings, in which.

DESCRIPTION OF EMBODIMENTS

The disclosed methods and systems will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

Figure 1:
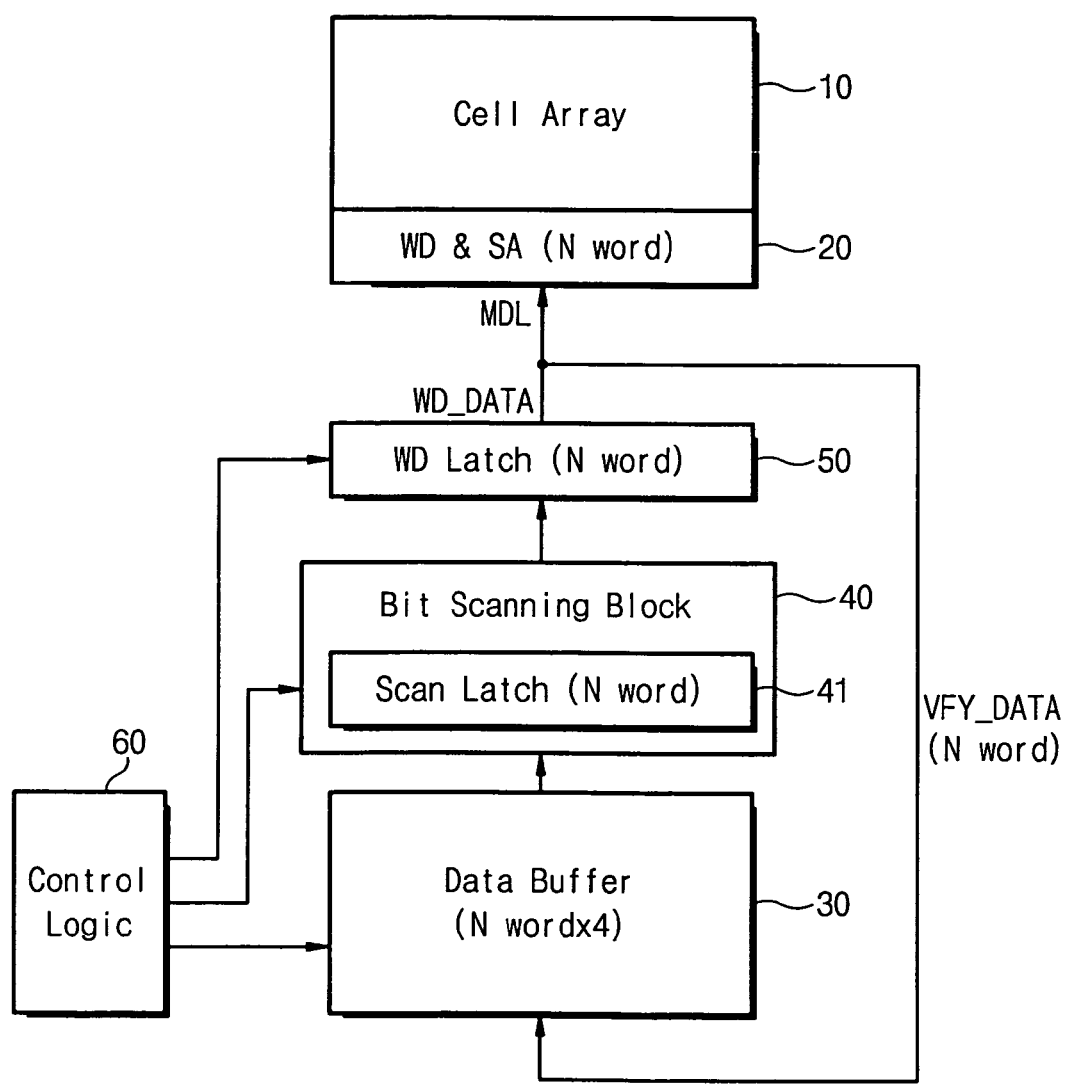
FIG. 1 shows a block diagram of a conventional semiconductor memory device with pipelined-buffer programming.
Figure 2:
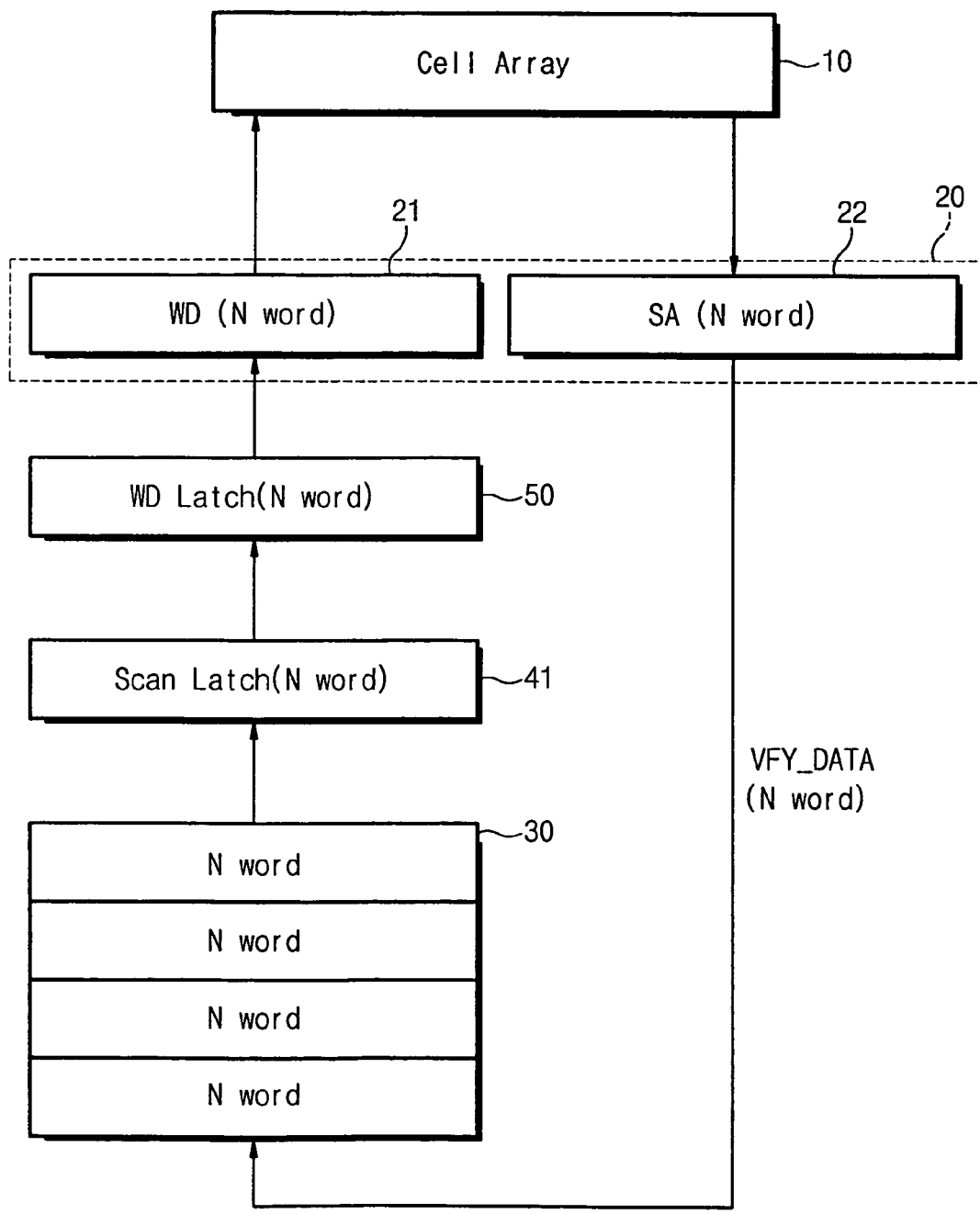
FIG. 2 shows a schematic data flow of a semiconductor memory device illustrated in FIG. 1.
Figure 3:
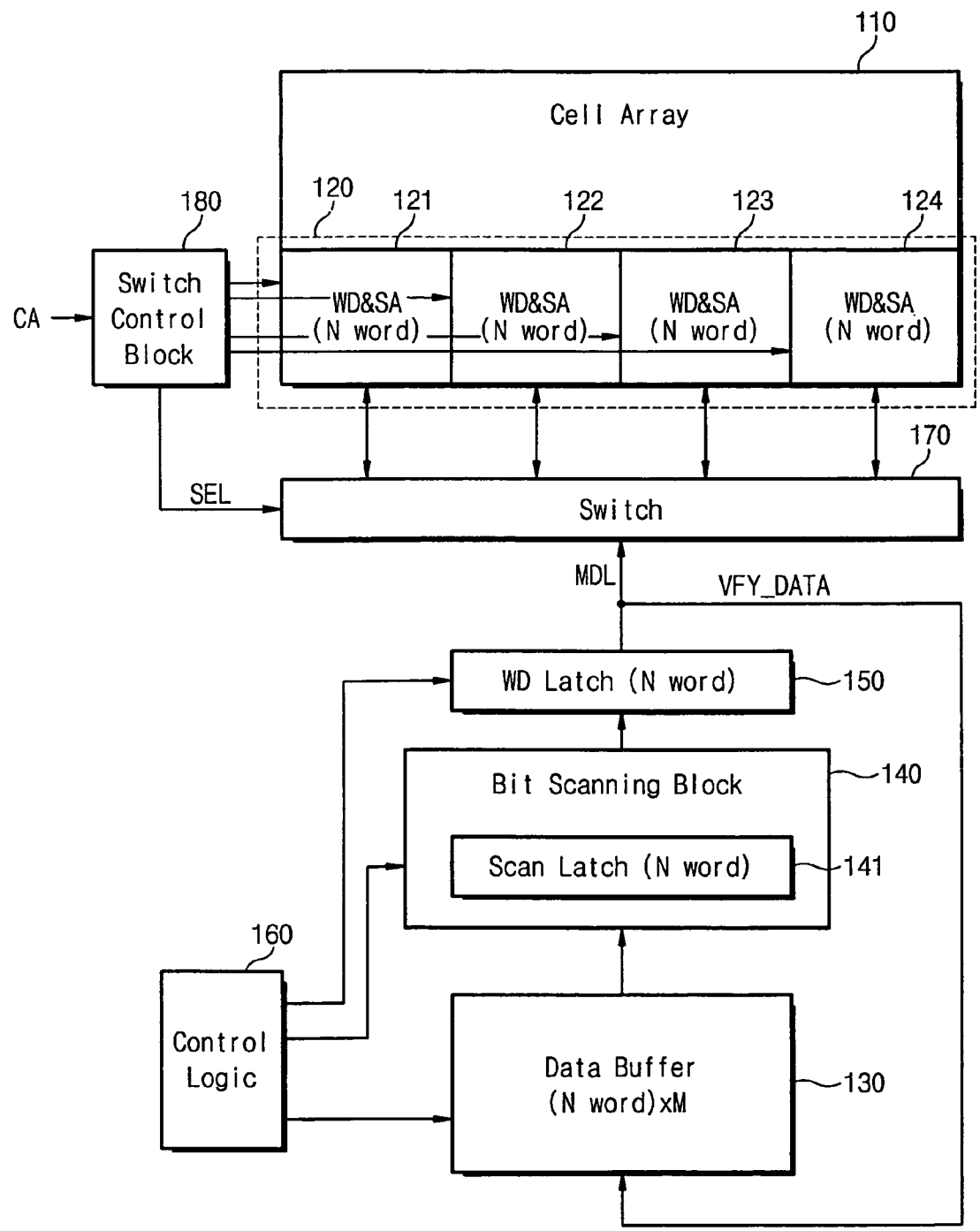
FIG. 3 shows a semiconductor memory device according to the disclosed methods and systems.

FIG. 3 schematically illustrates a block diagram of an exemplary semiconductor memory device according to the disclosed methods and systems. The exemplary semiconductor memory device is configured to use M times more sense amplifiers and write drivers as compared with the conventional semiconductor memory device shown in FIG. 1. The exemplary semiconductor memory device includes a write and sense block 120 (also commonly referred to as a sense amplifier and write driver block), a data buffer block 130, a bit scanning block 140, a write driver latch block 150, control logic 160 a switch block 170 and a switch control block 180. The write and sense block 120 is divided into M (e.g. four (4)) write and sense units 121, 122, 123 and 124.

Each of the write and sense units 121-124 can program N-word data during a program operation. One of the write and sense units 121, 122, 123 or 124 can be selected by the switch block 170 and the switch control block 180 at a given time.

Although not illustrated in FIG. 3, the cell array 110 can employ a plurality of NOR-type flash memory cells with each memory cell employing either SLC or MLC (e.g., 2-bit) data to provide a high storage capacity flash memory. Note that the cell array 110 illustrated in FIG. 3 may correspond to one memory bank.

Although not shown in FIG. 3, the write and sense block 120 may be coupled to the cell array 110 through a number of bit lines. The write and sense block 120 can program data provided from the write driver latch block 150 as well as sense data from the cell array 100. The exemplary write and sense block 120 according to the disclosed methods and systems includes four write and sense units 121-124, each of which has the same size as the sense amplifier and write driver block 20 illustrated in FIG. 1. As a result, the exemplary write and sense block 120 of FIG. 3 may be four times bigger than the sense amplifier and write driver block 20 of FIG. 1. While the exemplary write and sense block 120 is four times larger, it should be appreciated that the size of the write and sense block 120 can vary from embodiment to embodiment and not limited to this example.

Each of the write and sense units 121-124 is configured to sense and write/drive 4N-word data. As a result, the write and sense block 120 can sense 4N-word data during read operations. This means that the synchronous flash memory device according to the disclosed methods and systems can perform a continuous burst read operation at high speed without latency.

However, as described above, the expanded write and sense block 120 can lead to a relative increase in sensing noise/current when a program operation of a memory bank is performed. It should be appreciated that the sensing noise/current (commonly referred to as "verify-sensing noise/current") occurs during the verify read interval of a program operation. It should also be appreciated that the increase of the verify-sensing current caused during a program operation of a particular memory bank can influence read operations of adjacent memory banks. However, in accordance with the disclosed methods and systems, the verify-sensing current of the write and sense block 120 can be reduced by dividing the write and sense block 120 into separate write and sense units 121-124 and separately enabling each of the write and sense units 121-124. The result is that sensing noise is diminished. Although not illustrated in FIG. 3, generally, a column select circuit (not shown) that selects bit lines in response to a column address may be placed between the write and sense block 120 and the cell array 110.

The switch block 170 can be configured to select one of the four write and sense units 121, 122, 123 or 124 in the write and sense block 120 in response to select control information (e.g., decoded address signals) signal SEL. The switch block 170 can be configured to connect the selected write and sense unit 121, 122, 123 or 124 to the write driver latch block 150 during a program operation. This enables the write driver latch block 150 to provide N-bit data to the selected write and sense unit 121, 122, 123 or 124. Additionally, the switch block 170 can be configured to connect the selected write and sense unit 121, 122, 123 or 124 to the data buffer block 130 during a program verify operation. This enables verify-sensed data VFY_DATA (N-word data) to be transmitted from the selected write and sense unit 121, 122, 123 or 124 to the data buffer block 130. Subsequently, the transferred verify-sensed data VFY_DATA to the data buffer block 130 can be compared with loaded program data in order to estimate a pass or fail status of the program operation. In various embodiments the switch block 170 can be configured to operate responsive to the select control information provided from the switch control block 180.

Program data from an external device can be loaded on the data buffer block 130, which can be configured to latch the program data of a larger size than that of the scan latch circuit 141 to perform the above-mentioned pipelined-buffer programming. In the present embodiment of FIG. 3, the scan latch circuit 141 has a size sufficient to latch N-word data, and the data buffer block 130 has a size sufficient to store four (4) times the N-word data. This enables the data buffer block 130 to supply program data to the scan latch circuit 141 continuously.

The bit scanning block 140 is configured to scan N-word program data bits from the data buffer 130 and to select valid program data bits (ex, [0] (SLC) or [10], [01], [00] (MLC)). The exemplary bit scanning block 140 includes the scan latch circuit 141 to support the bit scanning operation. The bit scanning block 140 can store the N-word program data in the scan latch circuit 141 and then scan or select valid program data bits.

The write driver latch block 150 can receive the valid program data bits from the bit scanning block 140 and provide the valid program data bits to the selected write and sense unit 121, 122, 123 or 124.

The control logic 160 can be configured to control the data buffer block 130, the bit scanning block 140, and the write driver latch block 150 so as to perform the pipelined-buffer programming. More particularly, the control logic 160 can be configured to control a bit scanning operation of the bit scanning block 140 while simultaneously control blocks 140 and 150 such that program data is transferred from the write driver latch block 150 to the selected write and sense unit 121, 122, 123 or 124. For example, while the write driver latch block 150 provides (i–1)th valid program data to the selected write and sense unit, the bit scanning unit 140 can perform an (i)th-bit scanning operation to select valid program data bits. Accompanied by the pipelined-buffer program, the bit scanning and program operations can be simultaneously performed, and thus the program speed of the exemplary flash memory device is improved.

Note that the switch control block 180 can be configured to select (and enable) one of the four write and sense units 121-124 in response to a column address CA. The switch control block 180 can also control the switch block 170 to connect the write driver latch block 150 and the selected write and sense unit 121, 122, 123 or 124.

As mentioned above, a flash memory device according to the disclosed methods and systems has an expanded structure of the write and sense block 120 without requiring the expansion of the write driver latch block 150, the scan latch circuit 141 and the I/O structure of the data buffer block 130. The flash memory device according to the disclosed methods and systems can program N-word data and read in excess of N-word data (ex, 4N-word data) during a Read-While-Write (RWW) operation. As a result, flash memory devices according to the disclosed methods and systems do not suffer from the excessive sensing noise/current and layout area as a function of expanding write and sense blocks. Furthermore, this approach can be realized without the changing the data buffer block 130, the bit scanning block 140 and the write driver latch block 150 that constitute a data input circuit.

Figure 4:
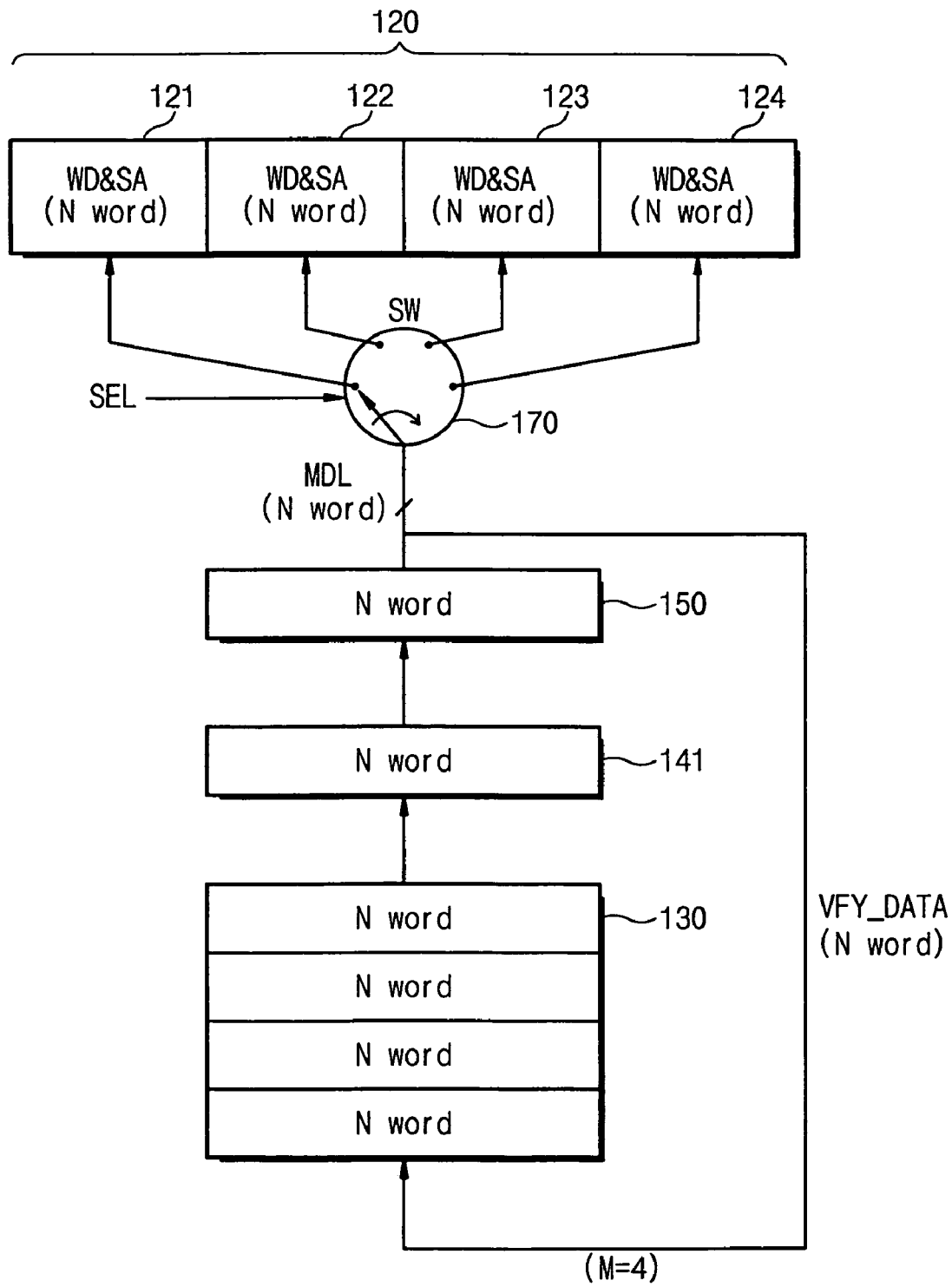
FIG. 4 shows a schematic data flow of the present semiconductor memory device.

FIG. 4 illustrates the data transmission and switching operation of the exemplary flash memory device illustrated in FIG. 3. Note that the exemplary flash memory device uses an expanded write and sense block architecture without requiring its data input circuitry, e.g., devices 130, 141 and 150, to undergo structure change.

Briefly, once a program operation commences, 4N-word program data can be loaded at the exemplary data buffer block 130, which has a size larger than that of the scan latch circuit 141. Note, however, that the I/O structure of the exemplary data buffer block 130 has the same size as that of the scan latch circuit 141. Thus, program data loaded on the data buffer block 130 can be sequentially transferred from the data buffer block to the scan latch circuit 141 in N-word units.

Next, the N-word program data in the scan latch circuit 141 can be scanned to select valid program data bits, and the selected valid program data bits can be transferred to the write driver latch block 150. The switch block 170 can then select one of the write and sense units 121-124 that comprise the N-word write drivers and N-word sense amplifiers.

The write drivers (not shown) of the selected write and sense unit 121, 122, 123 or 124 can drive bit lines based on valid program data bits from the write driver latch block 150. Sense amplifiers (not shown) of the selected write and sense unit 121, 122, 123 or 124 can sense cell data from the cell array 110 through bit lines (also not shown) during a program verify operation. Data sensed by the selected sense amplifiers can be transferred to the data buffer 130 as verify-sensed data VFY_DATA (i.e., N-word data).

As explained above, although a size of the write and sense block 120 is expanded, there is no need to expand a structure of the data input circuitry that is constituted by the data buffer block 130, the scan latch circuit 141 and the write driver latch block 150, which in turn enables verify-sensing noise/current to be reduced.

Figure 5:
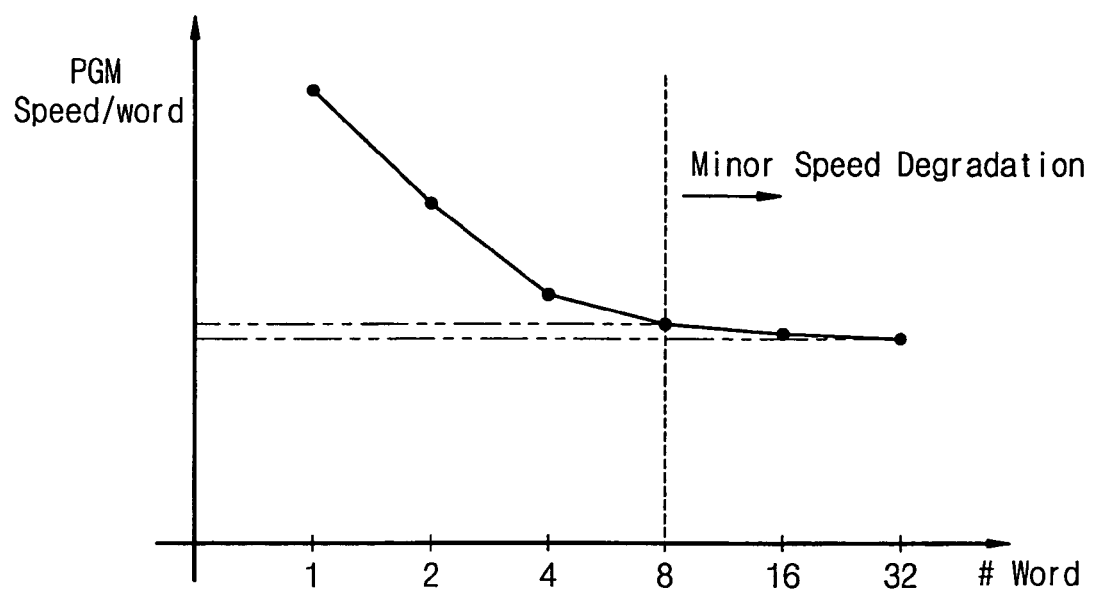
FIG. 5 is a graph for describing a program speed of a semiconductor memory device according to the disclosed methods and systems.

FIG. 5 shows a program speed of various exemplary flash memory devices performing pipelined-buffer programming. Referring to FIG. 5, the X-axis represents the number of word data to be programmed during one program period. The scale of the X-axis corresponds to the number of write drivers/sense amplifiers in each write and sense unit. The Y-axis represents a program speed per word. As shown in FIG. 5, the size of each write and sense unit is not proportional to the program speed.

In accordance with the disclosed methods and systems, as the size of a data input circuit (e.g., devices 130, 141 and 150 of FIG. 4) is enlarged, program speed is also improved in proportion to the enlarged size of the data input circuit. But, as also illustrated in FIG. 5, this effect is negligible when the size of the data input circuit becomes more than 8 words. For example, the speed of a 16-word size is not appreciably distinguished from that of an 8-word size. As the size of layout area is generally proportional to the size of the data input circuit, the tradeoff of increased speed versus increased area becomes less favorable. Eventually, to support pipelined-buffer program, an 8-word size (data input circuit and write and sense unit) may be the most desirable considering economical considerations. As a result, the flash memory device according to the disclosed methods and systems may need no additional latches in spite of expansion of sense amplifiers and write drivers.

Although the disclosed methods and systems have been described in connection with the embodiment of the disclosed methods and systems illustrated in the accompanying drawings, it is not limited thereto. It will be apparent to those skilled in the art that various substitution, modifications and changes may be thereto without departing from the scope and spirit of the invention.

What is claimed is:

1. A semiconductor memory device comprising:
a cell array having a plurality of memory cells;
a write driver circuit divided into N write units of the same size, wherein each write unit is capable of programming the memory cells with first data and wherein N is an integer of 2 or more;
a sense amplifier circuit divided into N read units of the same size, wherein each read unit is capable of sensing bit lines of the cell array during a program verify operation;
a selection circuit for selecting one of the write units and one of the read units in response to an input address; and
a data input circuit for providing the first data to the selected write unit during a program operation and for receiving verifying data from the selected read unit during the program verify operation.

2. The memory device of claim 1, wherein the selection circuit can select one of the write units and one of the read units in response to a column address.

3. The memory device of claim 1, further comprising:
a write buffer for storing program data bits, the write buffer having a data size larger than the first data;
a bit scanning circuit for storing the program data bits from the write buffer and scanning valid program data bits; and
a write driver latch for latching the scanned valid program data bits, the scanned valid program data bits being the first data.

4. The memory device of claim 1, wherein the data input circuit comprises:
a write buffer for storing program data bits, the write buffer having a data size larger than the first data;
a bit scanning circuit for storing the program data bits from the write buffer and scanning valid program data bits; and
a write driver latch for latching the scanned valid program data bits, the scanned valid program data bits being the first data.

5. The memory device of claim 3, wherein the write buffer has the same I/O structure as the write unit.

6. The memory device of claim 3, wherein the bit scanning circuit includes scan latch for storing the data bits from the write buffer.

7. The memory device of claim 3, wherein the write driver latch saves the scanned data bits temporarily and provides the scanned data bits to the write unit.

8. The memory device of claim 1, wherein the cell array consists of a memory bank.

9. The memory device of claim 1, wherein the plurality of memory cells are NOR-type flash memory cells.

10. A semiconductor memory device comprising:
a cell array having a plurality of memory cells;
a column select unit capable of selecting bit lines of the cell array in response to a column address;
a write driver circuit divided into a plurality of write units, each write unit programming memory cells with N-bit data during a programming cycle, wherein N is a positive integer; and
a sense amplifier circuit divided by a plurality of read units, each of which senses memory cells with N-bit data during a program verify operation;
a selection circuit responsive to a column address, selecting one among the write units during a programming operation and one among the read units during a program verify operation; and
a data input circuit supplying N bits of program data to the selected write unit during a program operation and receiving N bits of verify data from the selected read unit during the program verify operation,
wherein the data input circuit comprises:
a write buffer for storing program data bits, the write buffer having a data size larger than N-bit data;
a bit scanning unit for searching valid program bits among N-bit data received from the write buffer; and
a write driver latch for latching the scanned valid program data bits.

11. The memory device of claim 10, wherein the bit scanning unit comprises scan latch for storing the N-bit data received form the write buffer.

12. The memory device of claim 10, wherein the data input circuit further comprises a control unit for controlling the bit scanning unit and write driver latch to operate simultaneously, wherein the control unit is capable of determining a pass/fail based on received verify data.

13. The memory device of claim 10, wherein the read unit senses the N selected bit lines and generates program verify data during the program verify operation.

14. The memory device of claim 10, wherein the selection circuit enables a write unit and a read unit which are coupled to the bit lines selected by the column select unit.

15. The memory device of claim 10, wherein the cell array consists of a memory bank.

16. The memory device of claim 10, wherein the plurality of memory cells are NOR-type flash memory cells.

* * * * *